(12) United States Patent
Lv et al.

(10) Patent No.: US 11,296,235 B2
(45) Date of Patent: Apr. 5, 2022

(54) THIN FILM TRANSISTOR HAVING A WIRE GRID ON A CHANNEL REGION AND MANUFACTURING METHOD THEREOF, ARRAY SUBSTRATE AND MANUFACTURING METHOD THEREOF, AND DISPLAY PANEL

(71) Applicants: BOE TECHNOLOGY GROUP CO., LTD., Beijing (CN); BEIJING BOE DISPLAY TECHNOLOGY CO., LTD., Beijing (CN)

(72) Inventors: Zhenhua Lv, Beijing (CN); Lianjie Qu, Beijing (CN); Yanfeng Wang, Beijing (CN); Hongbo Feng, Beijing (CN); Xuewen Lv, Beijing (CN); Jiantao Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 763 days.

(21) Appl. No.: 16/067,297

(22) PCT Filed: Nov. 17, 2017

(86) PCT No.: PCT/CN2017/111502
§ 371 (c)(1),
(2) Date: Jun. 29, 2018

(87) PCT Pub. No.: WO2018/192217
PCT Pub. Date: Oct. 25, 2018

(65) Prior Publication Data
US 2021/0167222 A1 Jun. 3, 2021

(30) Foreign Application Priority Data

Apr. 19, 2017 (CN) .......................... 201710258247.7

(51) Int. Cl.
*H01L 29/786* (2006.01)
*H01L 27/12* (2006.01)

(52) U.S. Cl.
CPC ...... *H01L 29/78696* (2013.01); *H01L 27/127* (2013.01); *H01L 27/1222* (2013.01)

(58) Field of Classification Search
CPC . H01L 27/1214–1296; H01L 29/78696; H01L 27/127; H01L 27/1222; H01L 29/786–78696
See application file for complete search history.

(56) References Cited

U.S. PATENT DOCUMENTS

2005/0181587 A1* 8/2005 Duan .................. H01F 1/405
438/551
2006/0214156 A1* 9/2006 Pan .................. H01L 51/4266
257/40

(Continued)

FOREIGN PATENT DOCUMENTS

CN 202405260 U 8/2012
CN 104330915 A 2/2015

(Continued)

OTHER PUBLICATIONS

English translation of the written disclosure of CN 202405260 ("Zhao"), which was previously cited on an IDS.*

(Continued)

*Primary Examiner* — Kevin Parendo
(74) *Attorney, Agent, or Firm* — Leason Ellis LLP

(57) ABSTRACT

A thin film transistor and a manufacturing method thereof, an array substrate and a manufacturing method thereof, and a display panel are provided. The thin film transistor includes an active layer and a wire grid which is disposed at least on a surface of an active region of the active layer and is made of a conductive material. The active layer includes a source region, a drain region, and the channel region (Continued)

between the source region and the drain region. The wire grid includes a plurality of wire grid sections which are spaced apart from each other, and in a direction from the source region to the drain region, a length of the channel region is longer than a length of the wire grid section.

17 Claims, 7 Drawing Sheets

(56) References Cited

U.S. PATENT DOCUMENTS

| | | | | |
|---|---|---|---|---|
| 2010/0171546 | A1* | 7/2010 | Kwok | H01L 29/04 |
| | | | | 327/537 |
| 2013/0270223 | A1* | 10/2013 | Lee | G03F 7/0002 |
| | | | | 216/24 |
| 2016/0274285 | A1* | 9/2016 | Kang | G02B 5/3058 |
| 2016/0363812 | A1 | 12/2016 | Li | |
| 2017/0162712 | A1 | 6/2017 | Lu | |
| 2017/0162717 | A1 | 6/2017 | Lv et al. | |
| 2017/0294565 | A1* | 10/2017 | Kim | H01L 33/54 |
| 2018/0190676 | A1 | 7/2018 | Lv et al. | |

FOREIGN PATENT DOCUMENTS

| | | |
|---|---|---|
| CN | 104934444 A | 9/2015 |
| CN | 104992985 A | 10/2015 |
| CN | 105304651 A | 2/2016 |
| CN | 105789326 A | 7/2016 |
| CN | 106876479 A | 6/2017 |

OTHER PUBLICATIONS

International Search Report and Written Opinion in corresponding International Patent Application No. PCT/CN2017/111502, dated Feb. 24, 2018. 19 pages.

* cited by examiner

THIN FILM TRANSISTOR HAVING A WIRE GRID ON A CHANNEL REGION AND MANUFACTURING METHOD THEREOF, ARRAY SUBSTRATE AND MANUFACTURING METHOD THEREOF, AND DISPLAY PANEL

CROSS-REFERENCE TO RELATED PATENT APPLICATIONS

The application is a U.S. National Stage Application under 35 U.S.C. § 371 of International Patent Application No. PCT/CN2017/111502 filed Nov. 17, 2017, which claims priority to the Chinese patent application No. 201710258247.7, filed on Apr. 19, 2017, both of which are incorporated herein by reference in their entireties as part of the present application.

TECHNICAL FIELD

At least one embodiment of the present disclosure relates to a thin film transistor and a manufacturing method thereof, an array substrate and a manufacturing method thereof, and a display panel.

BACKGROUND

Nowadays, customers have increasingly high requirements for the resolution of a display product, and products with a high resolution gradually become the mainstream of the market. High resolution means a shortened charging time to pixels of each row of the device, and the on-state current of the corresponding switch element (e.g., a thin film transistor) needs to be increased so as to charge and discharge the pixel electrode in a shorter time period.

SUMMARY

At least one embodiment of the present disclosure provides a thin film transistor, comprising: an active layer, comprising a source region, a drain region, and a channel region between the source region and the drain region; and a wire grid, disposed at least on a surface of the active region of the active layer, made of a conductive material and comprising a plurality of wire grid sections which are spaced apart from each other, wherein in a direction from the source region to the drain region, a length of the channel region is longer than a length of each of the wire grid sections.

For example, the thin film transistor provided by at least one embodiment of the present disclosure further comprises a gate electrode which is disposed opposite to the active layer.

For example, in the thin film transistor provided by at least one embodiment of the present disclosure, the wire grid can be disposed on a side of the active layer that faces the gate electrode; or the wire grid can be disposed on a side of the active layer that faces away from the gate electrode; or the wire grid can be disposed both on the side of the active layer that faces the gate electrode, and on the side of the active layer that faces away from the gate electrode.

For example, in the thin film transistor provided by at least one embodiment of the present disclosure, the wire grid can be distributed on an entire surface of the active layer facing the gate electrode; and/or the wire grid can be distributed on an entire surface of the active layer facing away from the gate electrode.

For example, in the thin film transistor provided by at least one embodiment of the present disclosure, a length direction of the wire grid can be same as the direction from the source region to the drain region.

For example, in the thin film transistor provided by at least one embodiment of the present disclosure, the thin film transistor can comprise one of a top-gate thin film transistor, a bottom-gate thin film transistor and a dual-gate thin film transistor.

For example, in the thin film transistor provided by at least one embodiment of the present disclosure, a material of the wire grid can comprise a metal material or a transparent conductive material.

At least one embodiment of the present disclosure provides an array substrate, comprising the thin film transistor provided by any one embodiment mentioned above.

For example, in the array substrate provided by at least one embodiment of the present disclosure, the array substrate can comprise a plurality of sub-pixels, and each of the sub-pixels comprises a display area and a non-display area in a periphery of the display area; the thin film transistor is disposed in the non-display area, the wire grid is further at least disposed in the display area of the sub-pixel, and the wire grid is configured to allow light transmitted through the display area to have a first polarization direction.

For example, in the array substrate provided by at least one embodiment of the present disclosure, a thickness range of the wire grid is 50-200 nm, a period range is 100-200 nm, and a duty ratio range is 0.3-0.7; an interval between the wire grid sections which are adjacent and are disposed in a same extension line is 30-140 nm, and a length-width ratio of the wire grid section is no less than 10.

At least one embodiment of the present disclosure provides a display panel, comprising the array substrate provided by any one embodiment mentioned above.

At least one embodiment of the present disclosure provides a manufacturing method of a thin film transistor, comprising: forming an active layer and forming a wire grid on the active layer, wherein the active layer comprises a source region, a drain region and a channel region between the source region and the drain region, and the wire grid is at least partially overlapped with the channel region; the wire grid comprises a plurality of wire grid sections which are spaced apart from each other; and in a direction from the source region to the drain region, a length of the channel region is longer than a length of each of the wire grid sections.

For example, in the manufacturing method provided by at least one embodiment of the present disclosure, a method of forming the wire grid can comprise nanoimprint.

For example, in the manufacturing method provided by at least one embodiment of the present disclosure, the array substrate can comprise a plurality of sub-pixels, each of the sub-pixels comprises a display area and a non-display area in a periphery of the display area, and the manufacturing method comprises: forming an active layer and forming a wire grid on the active layer, wherein the active layer comprises a source region, a drain region and a channel region between the source region and the drain region, and the wire grid is at least partially overlapped with the channel region; the wire grid comprises a plurality of wire grid sections which are spaced apart from each other; and in a direction from the source region to the drain region, a length of the channel region is longer than a length of each of the wire grid sections.

For example, in the manufacturing method provided by at least one embodiment of the present disclosure, the wire grid is disposed at least in the display area of the sub-pixel, and the wire grid is formed to allow light transmitted through the display area to have a first polarization direction.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 1b is a partially enlarged schematic diagram of the active layer of the thin film transistor illustrated in FIG. 1a;

FIG. 1c is a top view of the thin film transistor illustrated in FIG. 1a;

FIG. 4b is a sectional view of an area A of the array substrate illustrated in FIG. 4a;

FIG. 4c is a partial schematic diagram of the array substrate illustrated in FIG. 4a;

DETAILED DESCRIPTION

Figure 1A:
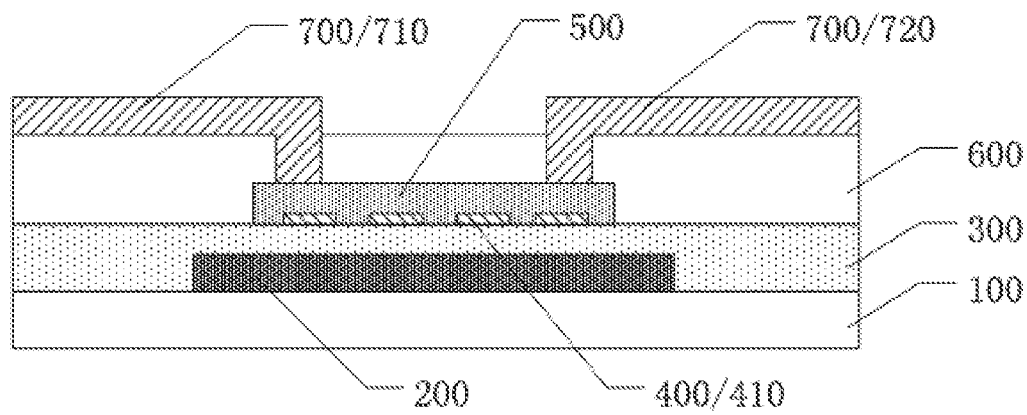
FIG. 1a is a sectional view of an thin film transistor provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relevant position relationship, and when the position of the object which is described is changed, the relevant position relationship may be changed accordingly.

The industry is continually increasing the resolution of a display device. For example, for a display device with a resolution of 4 K even 8 K, the charging time period for each row of pixels of the device needs to be shortened, that is, the on-state current of the switch element (e.g., a thin film transistor) needs to be increased. The most direct way to increase the on-state current of the switch element (e.g., the thin film transistor) is to increase the width-length ratio (W/L) of the channel region of the active layer of the thin film transistor. Limited to the conditions of the current process, it is difficult to further shorten the length of the channel region of the active layer, so the width of the channel region of the active layer is usually increased to realize a greater W/L. However, this method causes an increased space that is occupied by the thin film transistor in each pixel area, which causes a reduced aperture ratio of the pixel area.

At least one embodiment of the present disclosure provides a thin film transistor and a manufacturing method thereof, an array substrate and a manufacturing method thereof, and a display panel. The thin film transistor comprises an active layer and a wire grid which is disposed at least on a surface of a channel region of the active layer and made of a conductive material. The active layer comprises a source region, a drain region, and the channel region between the source region and the drain region. The wire grid comprises a plurality of wire grid sections which are spaced apart from each other, and in a direction from the source region to the drain region, a length of the channel region is longer than a length of each of the wire grid sections. The wire grid disposed at least on the channel region of the active layer is of a conductive material, thus the effective length of the channel region can be shorten so that the on-state current of the thin film transistor can be increased without increasing the width of the active layer. Further, the space occupied by the thin film transistor can be reduced.

Descriptions of a thin film transistor and a manufacturing method thereof, an array substrate and a manufacturing method thereof, and a display panel provided by at least one embodiment of the present disclosure are given below in combination of the accompanying drawings.

At least one embodiment of the present disclosure provides a thin film transistor. FIG. 1a is a sectional view of an thin film transistor provided by an embodiment of the present disclosure, FIG. 1b is a partially enlarged schematic diagram of the active layer of the thin film transistor illustrated in FIG. 1a, and FIG. 1c is a top view of the thin film transistor illustrated in FIG. 1a and is also a partial schematic diagram.

Figure 1B:
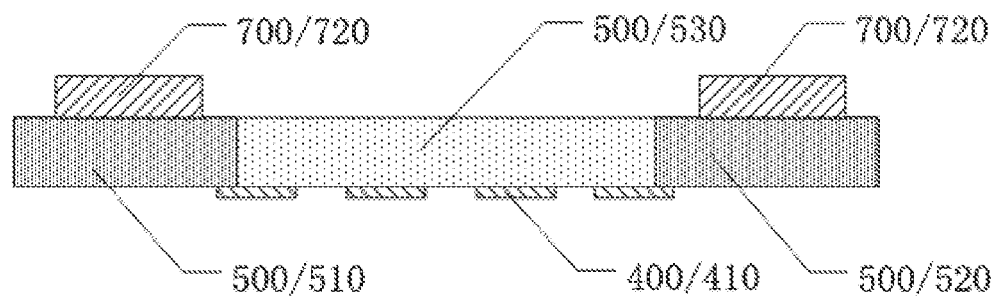
Figure 1C:
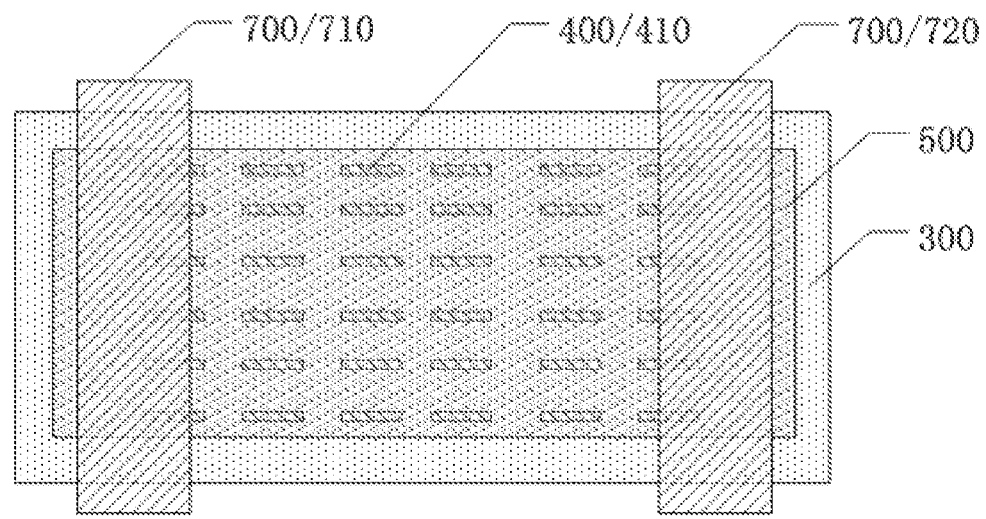

In at least one embodiment of the present disclosure, for example, as illustrated in FIG. 1a, FIG. 1b and FIG. 1c, the thin film transistor comprises: a base substrate 100; a gate electrode 200, a gate insulating layer 300, a wire gird 400, an active layer 500 and a source-drain electrode layer 700 (which can comprise a source electrode 710 and a drain electrode 720), which are disposed on the base substrate. The active layer 500 comprises a source region 510, a drain region 520 and a channel region 530 between the source region 510 and the drain region 520. The wire grid 400 is disposed at least on a surface of the channel region 530 of the active layer 500, and the wire grid 400 is of a conductive material. The wire grid 400 comprises a plurality of wire grid sections 410, and in a direction from the source region 510 to the drain region 520, a length of the channel region 530 is longer than a length of each wire grid section 410. The length of the channel region 530 being longer than the length of the wire grid section 410 enables the gap region between adjacent wire grid sections 410 is at least disposed within the range of the channel region 530.

In order to describe the locations of the components in the technical solution of the present disclosure conveniently, the locations of the components are accorded with directions taking the base substrate 100 of the thin film transistor as a reference. Exemplarily, taking the active layer 500 for example, "upper surface" of the active layer 500 means the surface away from the base substrate 100, and "lower surface" of the active layer 500 means the surface near the base substrate 100. Additionally, taking the active layer 500 for example, "upward direction" and "downward direction" of the active layer 500 means directions perpendicular to the plane that the base substrate 100 is located, "upward direction" means the direction that the active layer 500 is away from the base substrate 100, and "downward direction" means the direction that the active layer 500 is close to the base substrate 100. The direction from the source region 510 to the drain region 520 of the active layer 500 means "first direction", the length direction of the active layer 500 is parallel to the first direction, and the width direction of the active layer 500 is perpendicular to the first direction and the plane that the base substrate 100 is located.

In the channel region 530 of the active layer 500, the resistance of the portion of the channel region 530 which is covered by the wire grid sections 410 is reduced. It can be deemed that the portion of the channel region 530 is in parallel connection with the wire grid sections 410 so that the overall resistance of the active layer 500 is reduced and the on-state current of the thin film transistor is increased. In this way, the width of the active layer 500 needs not to be increased.

It should be noted that because the wire grid 400 is of a conductive material and the channel region 530 of the active layer 500 is of a semiconductor material, the resistivity of the wire grid 400 can be far less than the resistivity of the channel region 530 of the active layer 500 in the case that the wire grid 400 is in a good conductive condition.

Because compared to the resistivity of the channel region 530 of the active layer 500, the resistivity of the wire grid sections 410 is very small, and the resistivity of the wire grid sections 410 can be ignored here. In this way, the resistance of the portion of the channel region 530 which is covered by the wire grid sections 410 can be deemed as zero, which is taken as an example to describe the technical solutions of the below embodiments of the present disclosure. In this case, the effective length of the channel region 530 of the active layer 500 is equal to the sum of lengths of the portions of the channel region 530 which are not covered by the wire grid sections 410 in the same extension line parallel to the first direction.

For example, in the thin film transistor provided by at least one embodiment of the present disclosure, as illustrated in FIG. 1a, FIG. 1b and FIG. 1c, the length direction of the wire grid section 410 of the wire grid 400 (i.e., the extension direction of the wire grid section 410) can be the same as the first direction, and can also have a certain angle with respect to the first direction. The wire grid section 410 can be a straight line section, and can also be a curved line section or the like. The length direction and the shape of the wire grid section 410 is not limited in the present disclosure, as long as the wire grid sections disposed in the channel region 530 can shorten the length of the effective portion of the channel region 530 in the first direction but cannot electrically short the whole channel region 530. In order to explain the technical solutions of the present disclosure conveniently, in the below embodiments of the present disclosure, descriptions are given by taking the case that the wire grid section 410 is a straight line section and has a length direction in parallel with the first direction for example.

In the embodiment of the present disclosure, the type of the thin film transistor is not limited. For example, the thin film transistor can be a bottom-gate thin film transistor, a top-gate transistor, a dual-gate thin film transistor, or the like.

For example, in at least one embodiment of the present disclosure, the thin film transistor can be a bottom-gate thin film transistor, and the detailed structure of the thin film transistor can be referred to FIG. 1a and the relevant description of the aforesaid embodiments, which is not repeated here.

Figure 2A:
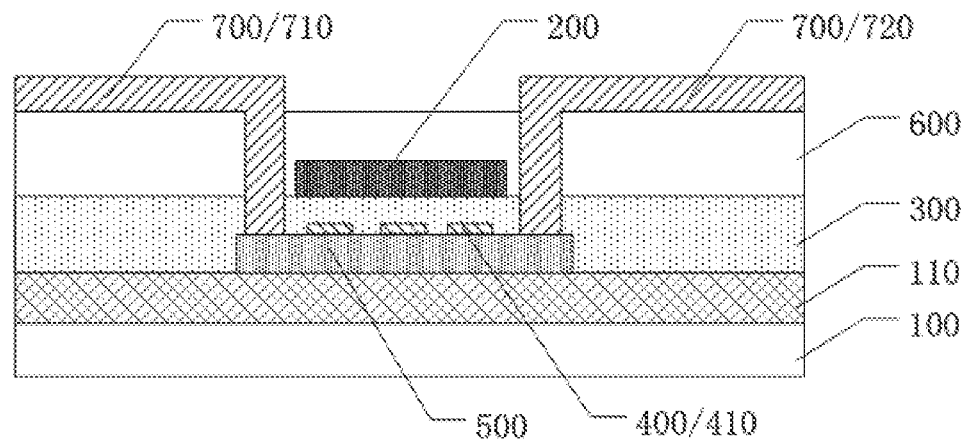
FIG. 2a is a sectional view of another thin film transistor provided by an embodiment of the present disclosure.

For example, in at least one embodiment of the present disclosure, the thin film transistor can be a top-gate thin film transistor, and FIG. 2a is a sectional view of another thin film transistor provided by an embodiment of the present disclosure. For example, as illustrated in FIG. 2a, the thin film transistor can comprise a base substrate 100, and an active layer 500, a wire gird 400, a gate insulating layer 300, a gate electrode 200, and a source-drain electrode layer 700 which are sequentially disposed on the base substrate 100. For example, a buffer layer 110 can be further disposed between the base substrate 100 and the active layer 500. In order to prevent the active layer 500 from light irradiation, a light shielding layer (not shown) corresponding to the active layer 500 can be further disposed between the active layer 500 and the base substrate 100.

The buffer layer 110 can be a transition layer between the base substrate 100 and the active layer 500 and can make the adhesion of the active layer 500 and the base substrate 100 stronger and can further prevent harmful impurities, ions and the like in the base substrate 100 from diffusing into the active layer 500. The material for forming the base substrate can comprise silicon oxide (SiOx), silicon nitride (SiNx), silicon oxynitride (SiOxNy) or the like. For example, the buffer layer can be a single-layer structure made of silicon nitride or silicon oxide, or a dual-layer structure or a multiple-layer structure made of silicon nitride and silicon oxide.

Figure 2B:
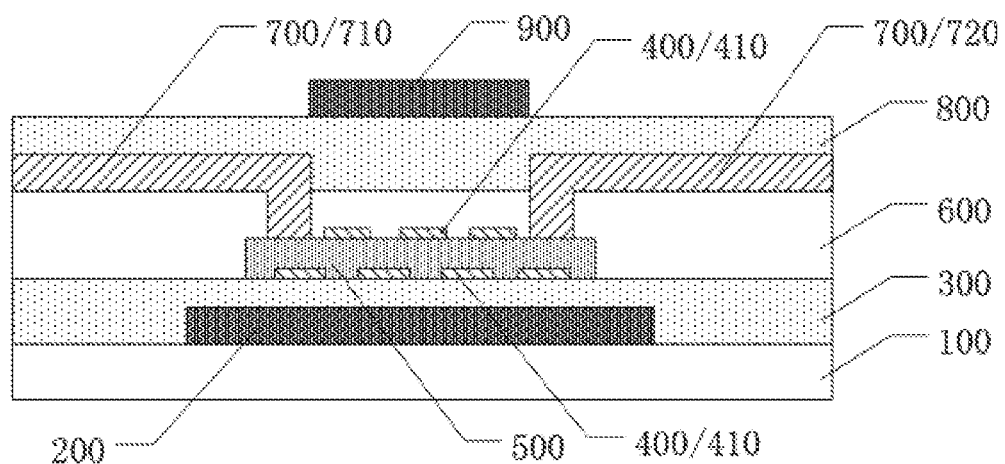
FIG. 2b is a sectional view of still another thin film transistor provided by an embodiment of the present disclosure.

For example, in at least one embodiment of the present disclosure, the thin film transistor can be a dual-gate thin film transistor, and FIG. 2b is a sectional view of still another thin film transistor provided by an embodiment of the present disclosure. For example, as illustrated in FIG. 2b, the thin film transistor can comprise: a base substrate 100, and a gate electrode 200, a gate insulating layer 300, a wire gird 400, an active layer 500, an insulating layer 600, a source-drain electrode layer 700, a passivation layer 800 and a second gate electrode 900 which are sequentially disposed on the base substrate 100; the gate electrode 700 can be a first gate electrode. The material of the passivation layer 800 can be silicon nitride (SiNx), silicon oxide (SiOx), acrylic resin or the like.

In embodiments of the present disclosure, locations of the wire gird on the active layer are not limited. For example, in the thin film transistor provide by at least one embodiment of the present disclosure, as illustrated in FIG. 1a, FIG. 2a and FIG. 2*b*, the wire grid 400 can be disposed on a side of the active layer 500 that faces the gate electrode 200, or on a side of the active layer 500 that faces away from the gate electrode 200, or the wire grid 400 is disposed on both the side of the active layer 500 that faces the gate electrode 200 and on the side of the active layer 500 that faces away from the gate electrode 200.

For example, in at least one embodiment of the present disclosure, the wire grid 400 is not limited to be only disposed in the channel region 530, but can also be disposed on an entire surface of the active layer 500 that faces the gate electrode 200 and/or on an entire surface of the active layer 500 that faces away from the gate electrode 200. The location of the gate electrode 200 is related to the type of the thin film transistor, so descriptions are given below by taking the case that the wire grid 400 is disposed on an entire surface of the active layer 500 that faces the gate electrode 200 and/or on an entire surface of the active layer 500 that faces away from the gate electrode 200 as an example. That is, the wire grid 400 can be disposed on the upper surface and/or the bottom surface of the active layer 500, and at least a portion of the wire grid 400 is disposed within the channel region 530 of the active layer 500. The specific location of the wire grid relative to the active layer 500 is not limited in the present disclosure.

In embodiments of the present disclosure, the set manner of the wire grid 400 is not limited. For example, in the thin film transistor provided by at least one embodiment of the present disclosure, the wire grid 400 is set in the thin film transistor by a way of nanoimprint or the like. The wire grid 400 can be of a metal material or a transparent conductive material. For example, the material for forming the wire grid 400 can comprise: a metal material such as molybdenum, titanium, copper, chromium or the like, or an alloy material formed by the above mentioned metals such as copper-based alloy materials comprising copper molybdenum alloy (CuMo), copper titanium alloy (CuTi), copper molybdenum titanium alloy (CuMoTi), copper molybdenum tungsten alloy (CuMoW), copper molybdenum niobium (CuMoNb), or the like, chromium-based alloy materials comprising chromium molybdenum alloy (CrMo), chromium titanium alloy (CrTi), chromium molybdenum titanium alloy (CrMoTi), or the like. For example, the transparent conductive material can comprise indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nano-tube or the like.

Figure 3:
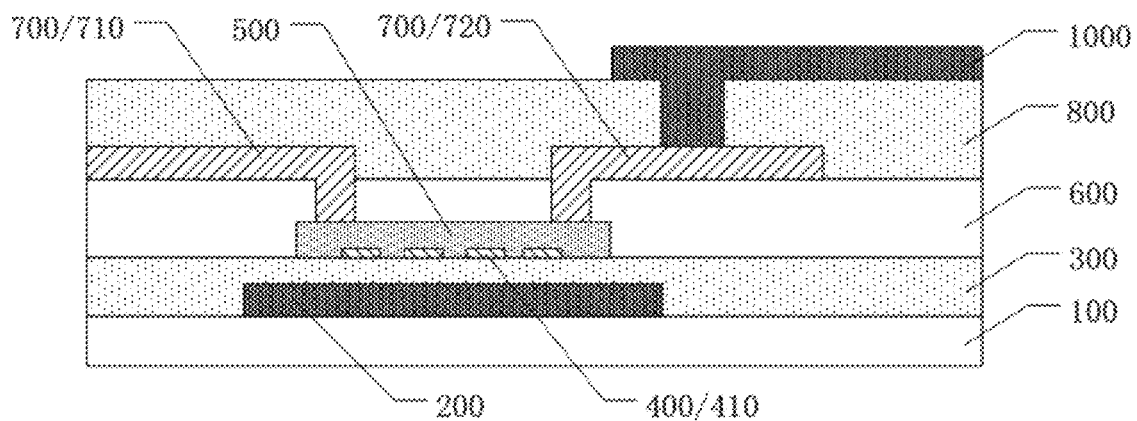
FIG. 3 is sectional view of an array substrate provided by an embodiment of the present disclosure.

At least one embodiment of the present disclosure discloses an array substrate, and the array substrate can comprise the thin film transistor provided by any one embodiment mentioned above. FIG. 3 is sectional view of an array substrate provided by an embodiment of the present disclosure and is a partial schematic diagram. For example, as illustrated in FIG. 3, the array substrate provided by at least one embodiment of the present disclosure can comprise the thin film transistor provided by any one embodiment mentioned above, a passivation layer 800 and a first electrode layer 1000 disposed on the source-drain electrode layer 700. The first electrode layer 1000 can be electrically connected with the drain electrode 720 of the source-drain electrode layer 700. The wire grid 400 can shorten the effective length of the channel region 530 and the on-state current of the thin film transistor can be increased without increasing the width of the active layer 500. Furthermore, the space occupied by the thin film transistor can be reduced so that the aperture ratio of the sub-pixel of the array substrate can be increased.

In some embodiments of the present disclosure, the wire grid 400 can be only disposed on the active layer 500. In some other embodiments of the present disclosure, the wire grid 400 can be further disposed at least in the display area of the array substrate, and the wire grid 400 can be configured as a polarization structure for replacing the structure such as a polarization plate or the like, so that the structure of the array substrate of a liquid crystal display device can be simplified.

Types of the thin film transistor can be plural and the set manner of the wire grid in the thin film transistor is relevant to the type of the thin film transistor. The technical solutions of the below embodiments of the present disclosure are described by taking the case that the thin film transistor is a bottom-gate thin film transistor and the wire grid 400 is disposed on the lower surface of the active layer 500 as an example.

For example, in at least one embodiment of the present disclosure, the array substrate can comprise a plurality of sub-pixels, and each of the sub-pixels comprises a display area and a non-display area in a periphery of the display area. The thin film transistor can be disposed in the non-display area, the wire grid 400 is further at least disposed in the display area of the sub-pixel, and the wire grid is configured to allow light transmitted through the display area to have a first polarization direction. The first polarization direction can be determined by the polarization direction of the transmitted light actually required for the array substrate, as long as the wire grid is configured to allow light transmitted through the display area to have a certain polarization direction, and the polarization direction can meet the actual requirements. The specific polarization direction of the first polarization direction is not limited in the present disclosure.

Figure 4A:
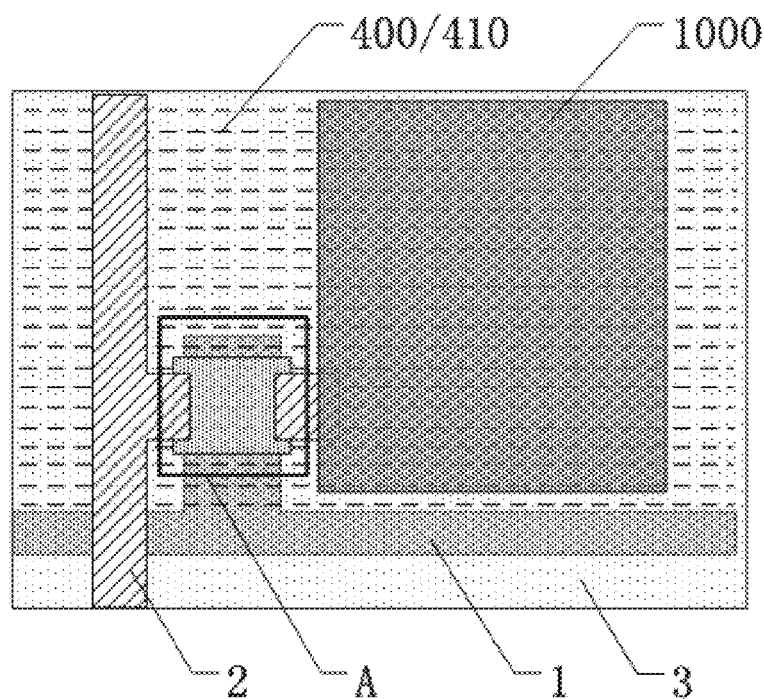
FIG. 4a is top view of another array substrate provided by an embodiment of the present disclosure.

FIG. 4*a* is top view of another array substrate provided by an embodiment of the present disclosure and is a schematic diagram of one sub-pixel. In one embodiment of the present disclosure, for example, as illustrated in FIG. 4*a*, a gate line 1 and a data line 2 define an area of a sub-pixel, and the first electrode layer 1000 can be a pixel electrode. The area pixel the electrode 1000 corresponds to can be the display area of the sub-pixel, the sub-pixel area outside the display area is the non-display area of the sub-pixel, and the thin film transistor A can be disposed in the non-display area.

For example, in at least one embodiment of the present disclosure, the wire grid 400 disposed in the thin film transistor can be disposed on the lower surface of the active layer 500, and can also be disposed in the upper surface of the active layer 500, the set manner of the wire grid 400 in the thin film transistor can be referred to relevant descriptions in the first embodiment, which is not repeated here.

In embodiments of the present disclosure, the parameters needed for the wire grid 400 to function as a polarization structure is not limited and can be set according to actual needs. For example, in at least one embodiment of the present disclosure, in the direction perpendicular to the plane that the base substrate 100 is located, the thickness range of the wire grid 400 is about 50-200 nm, the period range is about 100-200 nm, and the duty ratio range is about 0.3-0.7; the interval between the wire grid sections 410 which are adjacent and are disposed in a same extension line is about 30-140 nm, and a length-width ratio of the wire grid section 410 can be no less than 10.

Figure 4B:
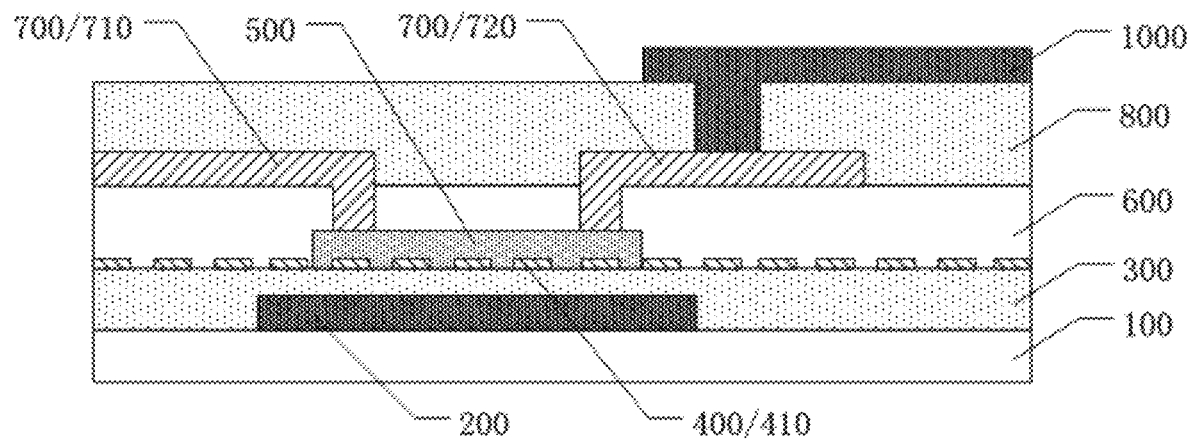
Figure 4C:
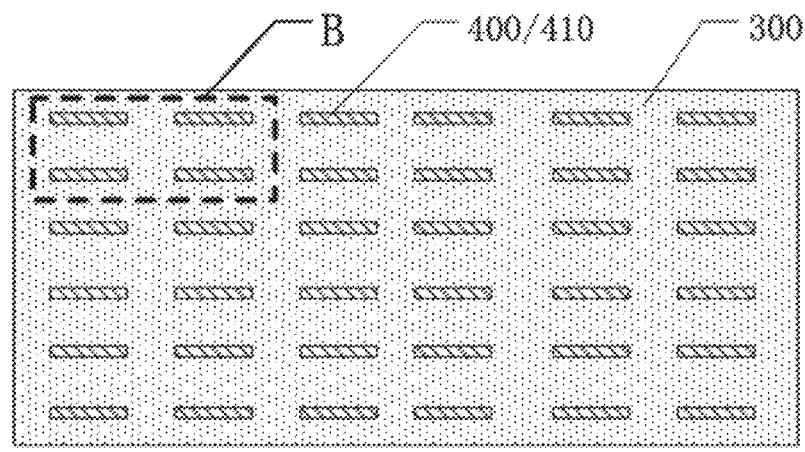
Figure 4D:
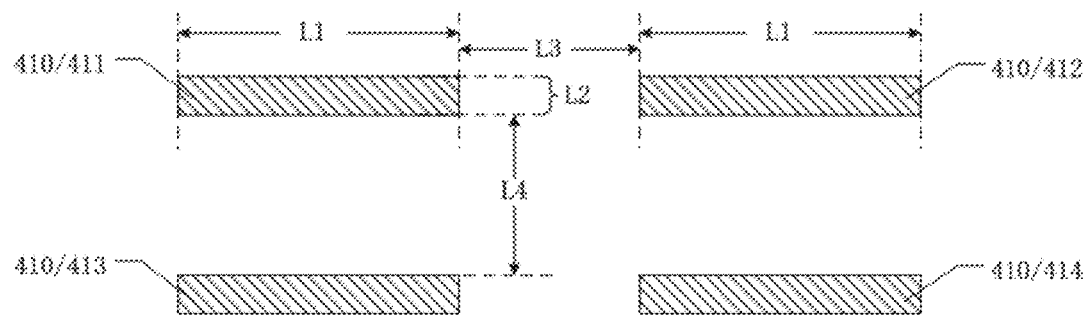
FIG. 4d is a sectional view of a area B of the array substrate illustrated in FIG. 4c.

FIG. 4*c* is a partial schematic diagram of the array substrate illustrated in FIG. 4*a*, and FIG. 4*d* is a sectional view of the B area of the array substrate illustrated in FIG. 4*c*. As illustrated in FIGS. 4*c* and 4*d*, structural parameters of the wire grid 400 are described taking a first wire grid section 411, a second wire grid section 412, a third wire grid section 413 and a fourth wire grid section 414 of the wire grid 400 as example. L1 and L2 are respectively the length and the width of the wire grid section 410, L3 is a row gap between adjacent wire grid sections 410 disposed in a same extension line, and L4 is a column gap between adjacent wire grid sections 410 disposed in different extension lines. The period of the wire grid section 400 is L2+L4, the range of which is 100-200 nm. The duty ratio of the wire grid 400 is L2/(L2+L4), the range of which is 0.3-0.7. The interval of the wire grid 400 is L3, the range of which is 30-140 nm. The length-width ratio L1/L2 is no less than 10.

It should be noted that in the case that the wire grid 400 functions as a polarization structure, the detailed structural parameters of the wire grid 400 are not limited to the value ranges mentioned above, and the structural parameters of the wire grid 400 can be determined according to actual needs, which is not limited by embodiments of the present disclosure.

For example, in at least one embodiment of the present disclosure, the array substrate can apply in for example a liquid crystal display panel, an organic light-emitting diode display panel, an e-paper display panel or the like. Accordingly, the first electrode layer 1000 can have different structures.

For example, in an embodiment of the present disclosure, the first electrode layer 1000 is a pixel electrode, and the material of the pixel electrode 1000 can comprise indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nano tube, or the like.

For example, in another embodiment of the present disclosure, the first electrode layer 1000 is an anode electrode or a cathode electrode of an organic light-emitting diode. Taking the first electrode layer 1000 as the anode electrode of an organic light-emitting diode for example, the array substrate can comprise an organic functional layer and a cathode on the anode electrode 1000. For example, the organic functional layer can comprise a hole transportation layer, a light-emitting layer, and an electron transportation layer. In order to enhance the injection efficiency of holes and electrons into the light-emitting layer, the organic functional layer can comprise an electron injection layer between the cathode and the electron transportation layer, and a hole injection layer between the anode and the hole transportation layer.

In the case that the first electrode layer 1000 functions as the anode electrode, the material for forming the first electrode layer 1000 can be a conductive material or a metal material. For example, the materials for forming the first electrode layer 1000 comprise indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nano tube, or the like. In the case the first electrode layer 1000 functions as the cathode electrode, the material for forming the first electrode layer 1000 can be a metal such as silver, aluminum, calcium, indium, lithium, magnesium, or the like, or a metal alloy of them (e.g., magnesium silver alloy) or the like.

At least one embodiment of the present disclosure provides a display panel, and the display panel can comprise the array substrate provided by any one embodiment mentioned above. The display panel can apply in any product or component having display functions, such as a cellphone, a tablet computer, a television, a display device, a laptop, a digital photo frame and the like.

One example of the display panel is a liquid crystal display panel, which can comprise an array substrate and an opposing substrate. The array substrate and the opposing substrate are oppositely disposed to form a liquid crystal cell, which is filled with liquid crystal materials. The opposing substrate can be a color filter substrate for example. The pixel electrode of each pixel unit of the array substrate is configured to generate an electrical field to control the rotating degrees of the liquid crystal materials so as to realize display.

Another example of the display panel is an organic light-emitting diode (OLED) display panel. The array substrate of display panel can be formed with a stacked structure of organic light-emitting functional layers, and the cathode or the anode of each pixel unit is configured to drive the organic light-emitting material to emit light so as to realize display.

Still another example of the display panel is an e-paper display panel, the array substrate of the display panel is formed with an electronic ink layer, and the pixel electrode of each pixel unit of the array substrate is configured to apply a voltage to drive the charged micro particles in electronic ink to move so as to realize the display.

At least one embodiment of the present disclosure provides a manufacturing method of a thin film transistor. The manufacturing method comprises: forming an active layer and forming a wire grid on the active layer, wherein the active layer comprises a source region, a drain region and a channel region between the source region and the drain region, and the wire grid is at least partially overlapped with the channel region. The wire grid comprises a plurality of wire grid sections which are spaced apart from each other; and in a direction from the source region to the drain region, a length of the channel region is longer than a length of the wire grid section. The wire grid can shorten the effective length of the active region and the on-state current of the thin film transistor can be increased without increasing the width of the active layer. Further, the space occupied by the thin film transistor can be reduced.

It should be noted that the detailed structure of the thin film transistor manufactured by the manufacturing method provided by embodiments of the present disclosure can be referred to the relevant descriptions about the thin film transistor provide by the aforesaid embodiments, which is not repeated here.

FIGS. 5a-5f are process diagrams of a manufacturing method of a thin film transistor provided by an embodiment of the present disclosure. Taking the structure of the thin film transistor as illustrated in FIG. 1a for example, as illustrated in FIG. 5a-FIG. 5f, in at least one embodiment of the present disclosure, the manufacturing method can comprise the following steps.

Figure 5A:
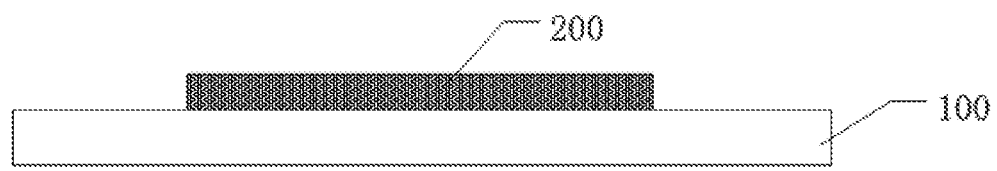
FIGS. 5a-5f are process diagrams of a manufacturing method of a thin film transistor provided by an embodiment of the present disclosure.

As illustrated in FIG. 5a, a base substrate 100 is provided, a gate electrode film is deposited on the base substrate 100, and a patterning process is performed to the gate electrode film to form a gate electrode 200.

For example, the material of the base substrate 100 can be a transparent material, for example, glass, transparent resin or the like.

In embodiments of the present disclosure, the material for forming the gate electrode is not limited. For example, the material of the gate electrode 200 can be a copper-based metal, such as copper (Cu), copper molybdenum alloy (Cu/Mo), copper titanium alloy (Cu/Ti), copper molybdenum titanium alloy (Cu/Mo/Ti), copper molybdenum tungsten alloy (Cu/Mo/W), copper molybdenum niobium (Cu/Mo/Nb), or the like. The material of the gate electrode 200 can also be a chromium-based alloy material such as chromium molybdenum alloy (Cr/Mo), chromium titanium alloy (Cr/Ti), chromium molybdenum titanium alloy (Cr/Mo/Ti), or the like. The material of the gate electrode 200 can also be aluminum, aluminum alloy or the like.

In at least one embodiment of the present disclosure, the patterning process can be a lithography patterning process for example, which can for example comprise: coating a photoresist layer on the structure layer to be patterned, applying a mask to expose the photoresist layer, developing the exposed photoresist layer to obtain a photoresist pattern, using the photoresist pattern as mask to etch the structure layer, and removing the photoresist pattern optionally.

Figure 5B:
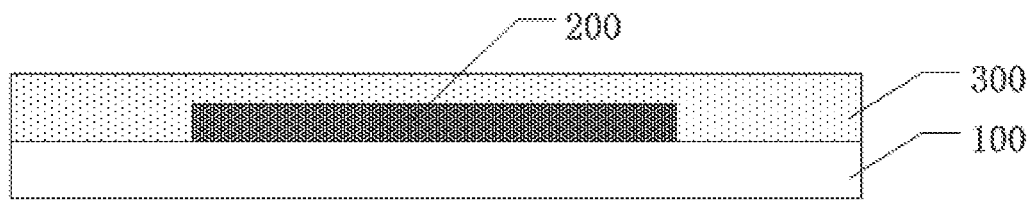

As illustrated in FIG. 5b, a gate insulating layer film is deposited on the base substrate 100 to form the gate insulating layer 300.

In embodiments of the present disclosure, a material for forming the gate insulating layer is not limited. For example, the material of the gate insulating layer 300 can comprise silicon nitride (SiNx), silicon oxide (SiOx), silicon oxynitride (SiOxNy), aluminum oxide ($Al_2O_3$), aluminum nitride (AlN) or other suitable materials.

Figure 5C:
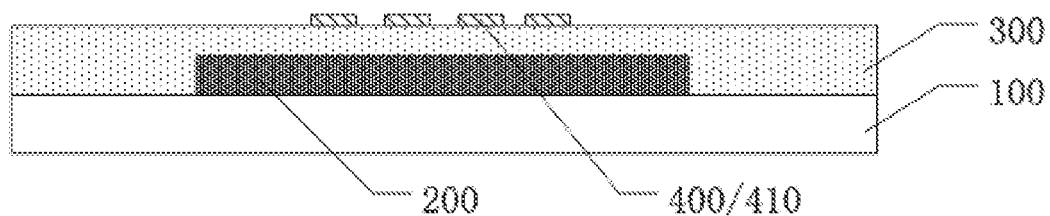

As illustrated in FIG. 5c, a wire grid 400 is formed on the gate insulating layer 300. The descriptions about the structure and the material of the wire grid 400 can be referred to the relevant descriptions of the aforesaid embodiments (about the thin film transistor), which is not repeated here.

Figure 5D:
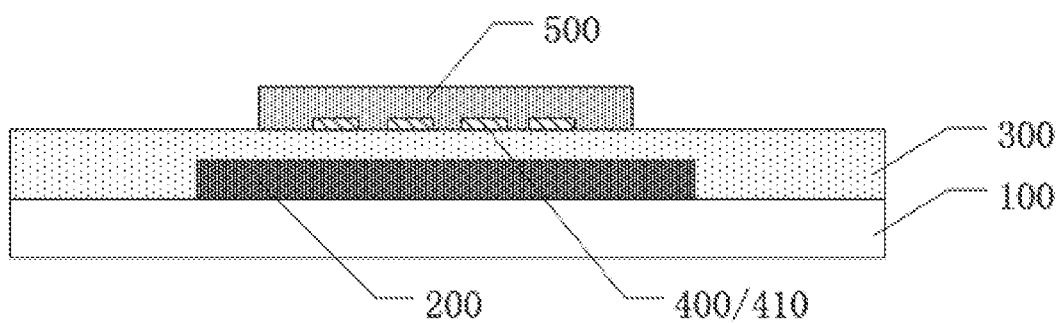

As illustrated in FIG. 5d, a semiconductor film is formed on the base substrate and a patterning process is performed to the semiconductor film to form the active layer 500.

In embodiments of the present disclosure, a material for forming the active layer is not limited. For example, the material of the active layer can comprise amorphous silicon, poly-silicon, and metal oxide such as indium gallium zinc oxide (IGZO), indium zinc oxide (IZO), zinc oxide (ZnO), or gallium zinc oxide (GZO).

Figure 5E:
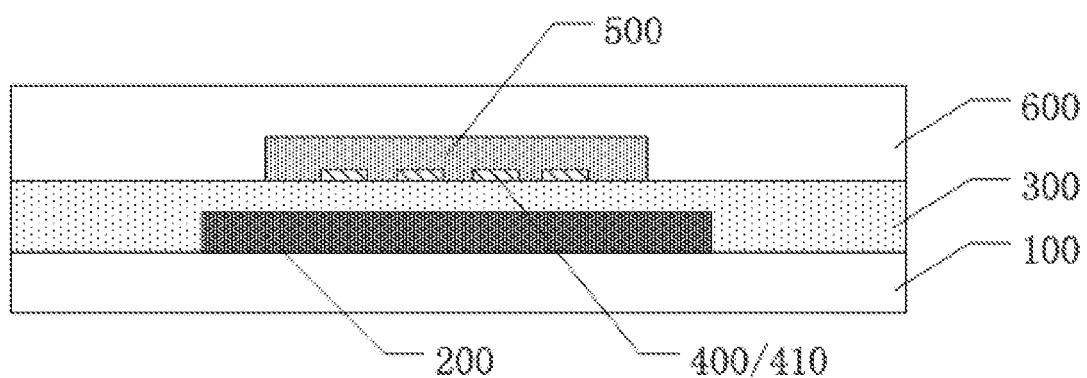

As illustrated in FIG. 5e, an insulating layer film is formed on the base substrate to form an insulating layer 600.

In embodiments of the present disclosure, a material for forming the insulating layer is not limited. For example, the material of the insulating layer can be silicon nitride, silicon oxide or the like.

Figure 5F:
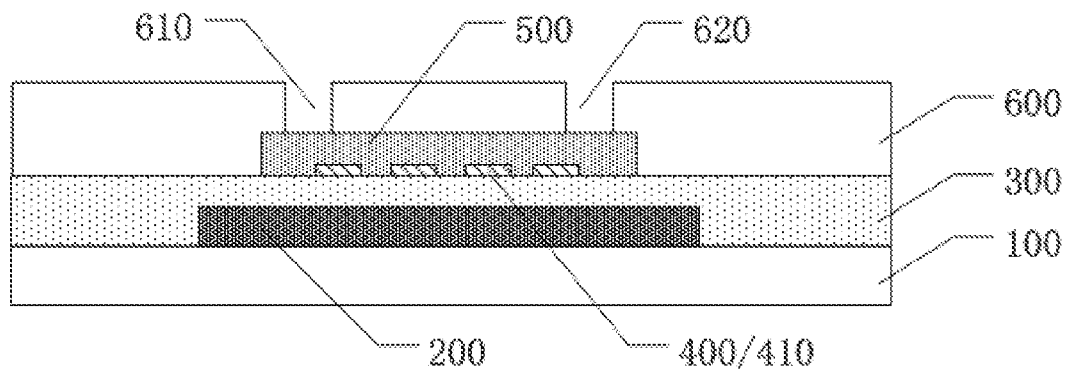

As illustrated in FIG. 5f, a first via hole 610 and a second via hole 620 are formed in the insulating layer 600, and the first via hole 610 and the second via hole 620 can expose parts of the active layer 500.

As illustrated in FIG. 1a, a conductive layer film is deposited on the base substrate 100 and a patterning process is performed to the conductive layer film to form the source-drain electrode layer 700, which can comprise a source electrode 710 and a drain electrode 720. For example, the source electrode 710 can be electrically connected with the active layer 500 through the first via hole 610, and the drain electrode 620 can be electrically connected with the active layer 500 through the second via hole 620.

In embodiments of the present disclosure, the material for forming the source-drain electrode layer is not limited. For example, the material for forming the source-drain electrode layer 700 can comprise a metal material such as molybdenum, titanium, copper, chromium, or the like; or an alloy material formed by the above mentioned metals such as a copper-based alloy material comprising copper molybdenum alloy (CuMo), copper titanium alloy (CuTi), copper molybdenum titanium alloy (CuMoTi), copper molybdenum tungsten alloy (CuMoW), copper molybdenum niobium (CuMoNb), or the like, chromium-based alloy materials comprising chromium molybdenum alloy (CrMo), chromium titanium alloy (CrTi), chromium molybdenum titanium alloy (CrMoTi), or the like.

At least one embodiment of the present disclosure provides a manufacturing method of the array substrate. The array substrate comprises a plurality of sub-pixels, each of the sub-pixels comprises a display area and a non-display area in a periphery of the display area. The manufacturing method comprises: forming an active layer and forming a wire grid on the active layer, wherein the active layer comprises a source region, a drain region and a channel region between the source region and the drain region, and the wire grid is at least partially overlapped with the channel region; the wire grid comprises a plurality of wire grid sections which are spaced apart from each other; and in a direction from the source region to the drain region, a length of the channel region is longer than a length of the wire grid section.

In the array substrate obtained by the manufacturing method of the above mentioned embodiments of the present disclosure, the wire grid can shorten the effective length of the channel region and the on-state current of the thin film transistor can be increased without increasing the width of the active layer. Furthermore, the space occupied by the thin film transistor can be reduced so that the aperture ratio of the sub-pixel of the array substrate can be increased.

For example, in the manufacturing method provide by at least one embodiment of the present disclosure, the wire grid can be formed at least in the display area of a sub-pixel, and the wire grid is formed to allow light transmitted through the display area to have a first polarization direction, so that the structure of the array substrate can be simplified, which is helpful to realize a light-weight and thin profile design of the product (i.e., a display panel).

It should be noted that the detailed structure of array substrate manufactured by the manufacturing method of the embodiments of the present disclosure can be referred to the relevant descriptions about the array substrate in the second embodiment, which is not repeated here.

Figure 6A:
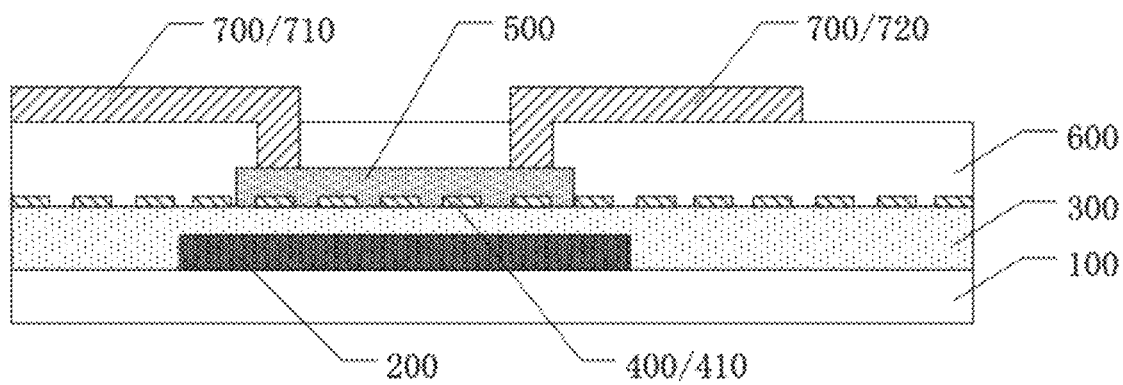
FIGS. 6a-6c are process diagrams of a manufacturing method of an array substrate provided by an embodiment of the present disclosure.
Figure 6B:
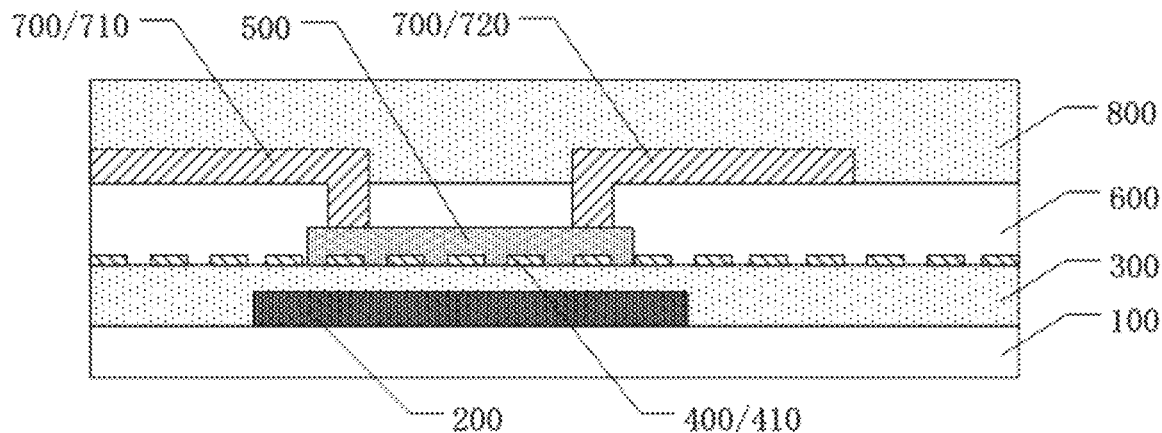
Figure 6C:
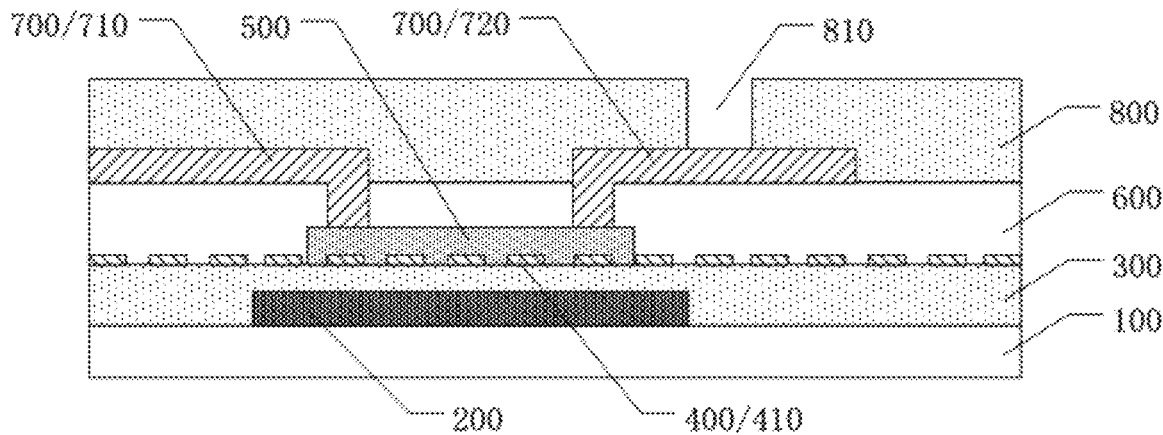

In order to explain the manufacturing method in at least one embodiment of the present disclosure, the process of the manufacturing method is described in at least one example of an embodiment of the present disclosure and FIGS. 6a-6c are process diagrams of a manufacturing method of an array substrate provided by an embodiment of the present disclosure. Taking the structure of the array substrate as illustrated in FIG. 4b for example, as illustrated in FIG. 6a-FIG. 6c, in an example of the present disclosure, the manufacturing method can comprise the following steps.

It should be noted that for the manufacturing process of the wire grid 400 in the aforesaid embodiments (about the manufacturing method of the thin film transistor), in some embodiments of the present disclosure, the wire grid 400 can be only disposed on the active layer 500. In some other embodiments of the present disclosure, the wire grid 400 can be further disposed at least in the display area of the sub-pixel. The two set manners of the wire gird 400 can be referred to the relevant descriptions of the aforesaid embodiments, which is not repeated here.

The technical solutions of the below embodiments are described below, taking the wire grid 400 being formed as a polarization structure for example.

As illustrated in FIG. 6a, an array substrate formed with a thin film transistor is provided. The manufacturing process of the thin film transistor on the array substrate can be referred to the relevant descriptions in the fourth embodiment, which is not repeated in the embodiment of the present disclosure.

As illustrated in FIG. 6b, a passivation layer film is formed on the array substrate formed with a thin film transistor to form a passivation layer 800.

For example, a material of the passivation layer 800 can be silicon nitride (SiNx), silicon oxide (SiOx), acrylic resin and the like.

As illustrated in FIG. 6c, a patterning process is performed to the passivation layer 800 to form a third via hole 810. The third via hole 810 can expose part of the source-drain electrode layer 700, and the third via hole 810 can expose the drain electrode 720 of the source-drain electrode layer 700 for example.

As illustrated in FIG. 4b, a conductive layer film is formed on the base substrate 100 and a patterning process is performed to the conductive layer film to form a first electrode layer 1000. The first electrode layer 1000 can be electrically connected with the drain electrode 720 of the source-drain electrode layer 700 through the third via hole 810. The set manner of the first electrode layer 1000 can be referred to the relevant descriptions in the aforesaid embodiments (about the array substrate), which is not repeated here.

Embodiments of the present disclosure provide a thin film transistor and a manufacturing method thereof, an array substrate and a manufacturing method thereof, and a display panel, which can have at least one of the following benefits.

(1) At least one embodiment of the present disclosure provides a thin film transistor, and the channel region of the active layer of the thin film transistor is provided with a conductive wire grid, which can shorten the effective length of the channel region and increase the on-state current of the thin film transistor without increasing the width of the active layer.

(2) At least one embodiment of the present disclosure provides an array substrate, and the occupation of the thin film transistor comprised by the array substrate is (3) In the array substrate provided by at least one embodiment of the present disclosure, the wire grid can be further disposed at least in the display area of the array substrate, and the wire grid can be configured to allow light transmitted through the display area to have a first polarization direction so that the wire grid can replace a component such as a polarization plate and the like. In this way, the structure of the array substrate of the array substrate can be simplified The following statements should be noted about the embodiments of the present disclosure.

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, features in one embodiment or in different embodiments can be combined.

What are described above is related to the illustrative embodiments of the disclosure only and not limitative to the scope of the disclosure; the scopes of the disclosure are defined by the accompanying claims.

What is claimed is:

1. A thin film transistor, comprising:
   an active layer, comprising a source region, a drain region, and a channel region between the source region and the drain region; and
   a wire grid, disposed at least on a surface of the channel region of the active layer, made of a conductive material and comprising a plurality of wire grid sections which are spaced apart from each other,
   wherein in a direction from the source region to the drain region, a length of the channel region is longer than a length of each of the wire grid sections;
   and wherein an extension direction of each of the wire grid sections is same as the direction from the source region to the drain region, and a material of the active layer comprises an inorganic semiconductor material;
   a length of each of the wire grid sections along the extension direction is greater than a width of the each wire grid section along a width direction perpendicular to the extension direction.

2. The thin film transistor according to claim 1, further comprising:
   a gate electrode which is disposed opposite to the active layer.

3. The thin film transistor according to claim 2, wherein
   the wire grid is disposed on a side of the active layer that faces the gate electrode; or
   the wire grid is disposed on a side of the active layer that faces away from the gate electrode; or
   the wire grid is disposed on the side of the active layer that faces the gate electrode, and also on the side of the active layer that faces away from the gate electrode.

4. The thin film transistor according to claim 2, wherein
   the wire grid is distributed on an entire surface of the active layer facing the gate electrode; and/or
   the wire grid is distributed on an entire surface of the active layer facing away from the gate electrode.

5. The thin film transistor according to claim 1, wherein
   the thin film transistor comprises one of a top-gate thin film transistor, a bottom-gate thin film transistor and a dual-gate thin film transistor.

6. The thin film transistor according to claim 1, wherein a material of the wire grid comprises a metal material or a transparent conductive material.

7. An array substrate, comprising the thin film transistor of claim 1.

8. The array substrate according to claim 7, wherein the array substrate comprises a plurality of sub-pixels, and each of the sub-pixels comprises a display area and a non-display area in a periphery of the display area;
   the thin film transistor is disposed in the non-display area, the wire grid is further at least disposed in the display area of the sub-pixel, and the wire grid is configured to allow light transmitted through the display area to have a first polarization direction.

9. The array substrate according to claim 7, wherein
   a thickness range of the wire grid is 50-200 nm, a period range is 100-200 nm, and a duty ratio range is 0.3-0.7;
   an interval between the wire grid sections which are adjacent and are disposed in a same extension line is 30-140 nm, and a length-width ratio of the wire grid section is no less than 10.

10. A display panel, comprising the array substrate of claim 7.

11. The thin film transistor according to claim 1, wherein the plurality of wire grid sections are arranged in an array.

12. The thin film transistor according to claim 1, wherein the plurality of wire grid sections are on an outer surface of the channel region of the active layer.

13. The thin film transistor according to claim 1, wherein the plurality of wire grid sections are on both an outer surface and an inner surface of the channel region of the active layer.

14. A manufacturing method of a thin film transistor, comprising:
forming an active layer and forming a wire grid on the active layer,
wherein the active layer comprises a source region, a drain region and a channel region between the source region and the drain region, and the wire grid is at least partially overlapped with the channel region;
the wire grid comprises a plurality of wire grid sections which are spaced apart from each other; and in a direction from the source region to the drain region, a length of the channel region is longer than a length of each of the wire grid sections;
an extension direction of each of the wire grid sections is same as the direction from the source region to the drain region, and a material of the active layer comprises an inorganic semiconductor material;
the wire grid is disposed at least on a surface of the channel region of the active layer and is made of a conductive material;
a length of each of the wire grid sections along the extension direction is greater than a width of the each wire grid section along a width direction perpendicular to the extension direction.

15. The manufacturing method according to claim 14, wherein
a method of forming the wire grid comprises nanoimprint.

16. A manufacturing method of an array substrate, wherein
the array substrate comprises a plurality of sub-pixels, each of the sub-pixels comprises a display area and a non-display area in a periphery of the display area, and the manufacturing method comprises:
forming an active layer and forming a wire grid on the active layer,
wherein the active layer comprises a source region, a drain region and a channel region between the source region and the drain region, and the wire grid is at least partially overlapped with the channel region;
the wire grid comprises a plurality of wire grid sections which are spaced apart from each other; and in a direction from the source region to the drain region, a length of the channel region is longer than a length of each of the wire grid sections;
an extension direction of each of the wire grid sections is same as the direction from the source region to the drain region, and a material of the active layer comprises an inorganic semiconductor material;
the wire grid is disposed at least on a surface of the channel region of the active layer and is made of a conductive material;
a length of each of the wire grid sections along the extension direction is greater than a width of the each wire grid section along a width direction perpendicular to the extension direction.

17. The manufacturing method according to claim 16, wherein
the wire grid is disposed at least in the display area of the sub-pixel, and the wire grid is formed to allow light transmitted through the display area to have a first polarization direction.

* * * * *